United States Patent [19]

Fukui

[11] Patent Number: 5,420,800
[45] Date of Patent: May 30, 1995

[54] LAYOUT METHOD FOR A SEMICONDUCTOR INTEGRATED CIRCUIT DEVICE

[75] Inventor: Masahiro Fukui, Habikino, Japan

[73] Assignee: Matsushita Electric Industrial Co., Ltd., Osaka, Japan

[21] Appl. No.: 300,579

[22] Filed: Sep. 2, 1994

Related U.S. Application Data

[63] Continuation of Ser. No. 720,093, Jun. 24, 1991, abandoned.

[30] Foreign Application Priority Data

Jun. 26, 1990 [JP] Japan .................................. 2-167667

[51] Int. Cl.⁶ ............................................. G06F 17/50
[52] U.S. Cl. ..................................... 364/491; 364/490; 364/489; 364/488
[58] Field of Search ................. 364/491, 490, 489, 488

[56] References Cited

U.S. PATENT DOCUMENTS

| | | | |
|---|---|---|---|
| 4,500,963 | 2/1985 | Smith et al. | 364/491 |
| 4,577,276 | 3/1986 | Dunlop et al. | 364/491 |
| 4,613,941 | 9/1986 | Smith et al. | 364/490 |
| 4,630,219 | 12/1986 | DiGiacomo et al. | 364/488 |
| 4,686,629 | 8/1987 | Noto et al. | 364/491 |
| 4,752,887 | 6/1988 | Kuwahara | 364/491 |
| 4,823,276 | 4/1989 | Hiwatashi | 364/491 |
| 4,835,705 | 5/1989 | Fujino et al. | 364/491 |
| 4,910,680 | 3/1990 | Hiwatashi | 364/491 |
| 4,964,057 | 10/1990 | Yabe | 364/491 |
| 5,046,017 | 9/1991 | Yuyama et al. | 364/491 |
| 5,047,949 | 9/1991 | Yamaguchi et al. | 364/491 |

FOREIGN PATENT DOCUMENTS 63-308343 12/1988 Japan .

OTHER PUBLICATIONS

Fukui, M., et al., "SMILE: A Hierarchical Layout System for Building Block LSI", *International Journal of Computer Aided VLSI Design 1*, 281–303 (1989).

Primary Examiner—Vincent N. Trans
Attorney, Agent, or Firm—Panitch Schwarze Jacobs & Nadel

[57] ABSTRACT

A method is provided for designing a semiconductor integrated circuit device with optimized shape of blocks to minimize the size of the chip containing the circuit. Design restrictions on the shape and position of each block are determined according to the density of temporary paths for electrical connections between blocks and the shape of each side of each block is optimized within the restrictions. The internal layout of each block is then optimized according to the restrictions.

11 Claims, 8 Drawing Sheets

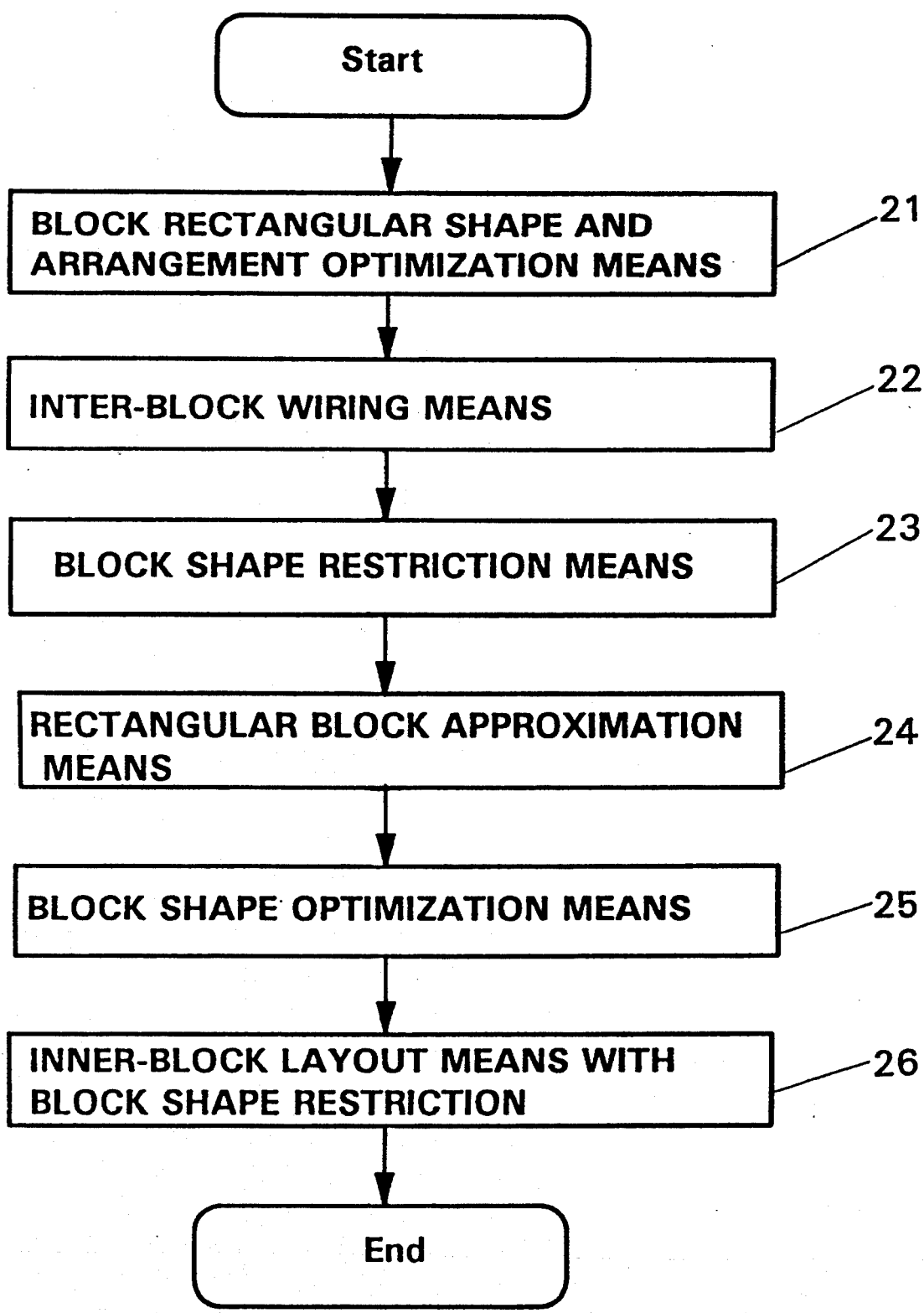

LAYOUT METHOD FOR A SEMICONDUCTOR INTEGRATED CIRCUIT DEVICE

This application is a continuation of the U.S. patent application Ser. No. 07/720,093 filed on Jun. 24, 1991, now abandoned.

BACKGROUND OF THE INVENTION

1. Field of the Invention

This invention relates to a layout method for a semiconductor integrated circuit device such as a VLSI, and more particularly to layout method for reducing the chip size of a semiconductor integrated circuit device. Such a layout method may be performed when the shapes of blocks formed on the chip are to be optimized, or when, after the completion of the layout process of a VLSI, the chip size is required to be further reduced.

2. Description of the Prior Art

In a semiconductor integrated circuit device such as a VLSI, generally, circuit elements are arranged in one or more blocks, and wirings for establishing electrical connections between the blocks and between terminals of the I/O cells and blocks are formed in the areas between the blocks. Hereinafter, such an area which is disposed between blocks or between the periphery of the I/O cells and a block and may be used as paths for wirings is referred to as "a wiring channel". An example of a layout method in which the block shape is optimize is disclosed by the inventor in copending U.S. patent application Ser. No. 07/340,750 filed Apr. 20, 1989 which is incorporated herein by reference. In this method, the block shape is approximated to be rectangular. Namely, it is supposed that each of the blocks is a rectangle having smooth or linear four sides (i.e., the sides of the block are linear, or are not irregular). Then, the block shape is optimized. Hereinafter, this method is referred to as "the first method".

Another layout method hereinafter, referred to as "the second method") is disclosed in Japanese patent publication (Kokai) No. SHO62(1987)-144,650. In the second method, cells each incorporating one or more circuit elements are arranged in single row to form a belt-like block, and the wiring density is averaged as much as possible by bending the belt-like block.

In the first method, the variation in wiring density in channels cannot be compensated, and therefore channels where the wiring density is low have blank portions which are not used for wiring. This causes a problem in that the chip size cannot be sufficiently reduced by the first method. On the other hand, the second method has a problem in that cells must be arranged in a single row and belt-like fashion, with the result that the second method cannot be used for optimizing the layout of a semiconductor integrated circuit device.

SUMMARY OF THE INVENTION

The layout method of this is invention, which overcomes the above-discussed and numerous other disadvantages and deficiencies of the prior art, is used for a semiconductor integrated circuit device wherein one or more blocks are arranged on a chip, and wirings for electrical connections are formed in areas in the vicinity of said blocks, and comprises the step of optimizing the shape of each o f the sides of said blocks, thereby minimizing the size of said chip. The chip size can be minimized by effectively controlling the irregularity of each block shape in the layout of a chip which contains blocks having cells and wirings.

Preferably, said optimizing step comprises the steps of: supposing that said blocks are rectangular, and temporarily optimizing the shape and position of each of said blocks; obtaining temporary paths for said electrical connections; placing restrictions on the shape of each of said blocks, in accordance with the density of said temporary paths; optimizing the shape of each of the sides of said blocks, while satisfying said restrictions; and optimizing the internal layout of each of said blocks, in accordance with said restrictions.

Another layout method according to the invention is used for a semiconductor integrated circuit device wherein one or more blocks in which standard cells are arranged in a plurality of rows are arranged on a chip, and electrical connections between said blocks are formed in areas in t he vicinity of said blocks, and comprises the step of optimizing the length of each of said rows to optimize the shape of each of the sides of said blocks, thereby minimizing the size of said chip. The chip size can be minimized by effectively controlling the irregularity of each block shape in the layout of a chip which contains blocks having standard cells arranged in a plurality of rows.

A further layout method according to the invention is used for a block in semiconductor integrated device, said block having plurality of cells, and for optimizing the layout of said block while satisfying a restriction against the shape of said block, and comprises the steps of: obtaining the number of cell rows by which the height of said block satisfies said restriction; obtaining the position and length of each of said cell rows; obtaining a cell placement by which each of said cell rows can be formed in said length; and obtaining paths for wirings between cells. When a restriction is imposed on the irregularity of block shape, blocks which satisfy the restriction can be formed by arranging the standard cells.

In another aspect of the invention, an apparatus for the layout of a semiconductor integrated circuit device wherein one or more blocks are arranged on a chip, and wirings for electrical connections are formed in areas in the vicinity of said blocks is provided. The apparatus comprises: means for supposing that said blocks are rectangular, and for temporarily optimizing the shape and position of each of said blocks; means for obtaining temporary paths for said electrical connections; means for placing restrictions on the shape of each of said blocks, in accordance with the density of said temporary paths; means for optimizing the shape of each of the sides of said blocks, while satisfying said restrictions; and means for optimizing the internal layout of each of said blocks, in accordance with said restrictions, thereby minimizing the size of said chip.

In a further aspect of the invention, an apparatus for the layout of a semiconductor integrated circuit device wherein one or more blocks in which standard cells are arranged in a plurality of rows are arranged on a chip, and electrical connections between said blocks are formed in areas in the vicinity of said blocks is provided. The apparatus comprises means for optimizing the length of each of E aid rows to optimize the shape of each of the sides of said blocks, thereby minimizing the size of said chip.

In a further aspect the invention, an apparatus for the layout of a block in a semiconductor integrated device, said block having a plurality of cells, and for optimizing the layout of said block while satisfying a restriction against the shape of said block is provided. The apparatus comprises: means for obtaining the number of cell rows by which the height of said block satisfies said restriction; means for the position and length of each of said cell rows; means for obtaining a cell placement by which each of said cell rows can be formed in aid length; and means for obtaining paths for wirings be between cells.

Thus, the invention described herein makes possible the objectives of:

(1) providing a layout method for a semiconductor integrated circuit device by which the chip size can be sufficiently minimized;

(2) providing a layout method for a semiconductor integrated circuit device in which the variation in wiring density in channels can be compensated;

(3) providing a layout method for a semiconductor integrated circuit device which is applicable irrespective of the block configuration;

(4) providing a layout method for a semiconductor integrated circuit device which is applicable irrespective of the restriction on the block shape;

(5) providing a layout method for a semiconductor integrated circuit device in which the cell row length can be adjusted;

(6) providing an apparatus for the layout of a semiconductor integrated circuit device by which the chip size can be sufficiently minimized;

(7) providing an apparatus for the layout of a semiconductor integrated circuit device in which the variation An wiring density in channels can be compensated;

(8) providing an apparatus for the layout of a semiconductor integrated circuit device which is applicable irrespective of the block configuration;

(9) providing an apparatus for the layout of a semiconductor integrated circuit device which is applicable irrespective of the restriction on the block shape; and

(10) providing an apparatus for the layout of a semiconductor integrated circuit device in which the cell row length can be adjusted.

BRIEF DESCRIPTION OF THE DRAWINGS

This invention may be better understood and its numerous objects and advantages will become apparent to those skilled in the art by reference to the accompanying drawings as follows:

FIG. 2 is a flow chart illustrating the process according to the invention

DESCRIPTION OF THE PREFERRED EMBODIMENTS

Figure 1A:
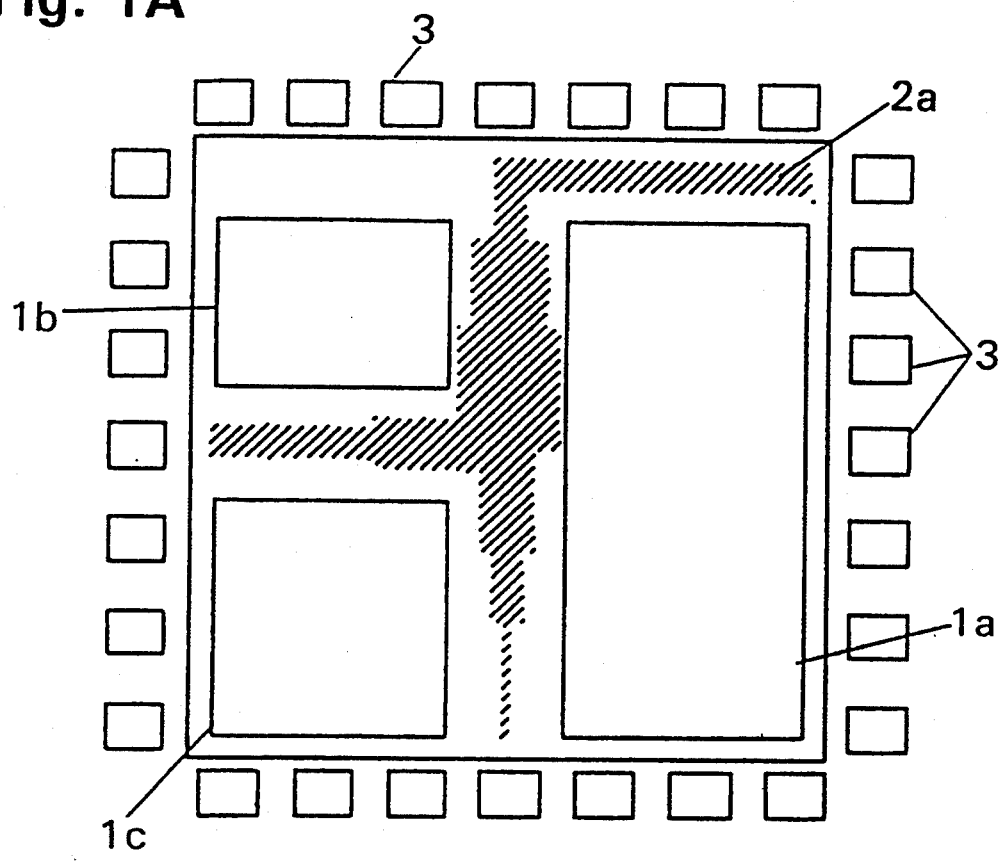
FIG. 1A illustrates the layout of the entire chip of a VLSI before the block shape optimization.
Figure 1B:
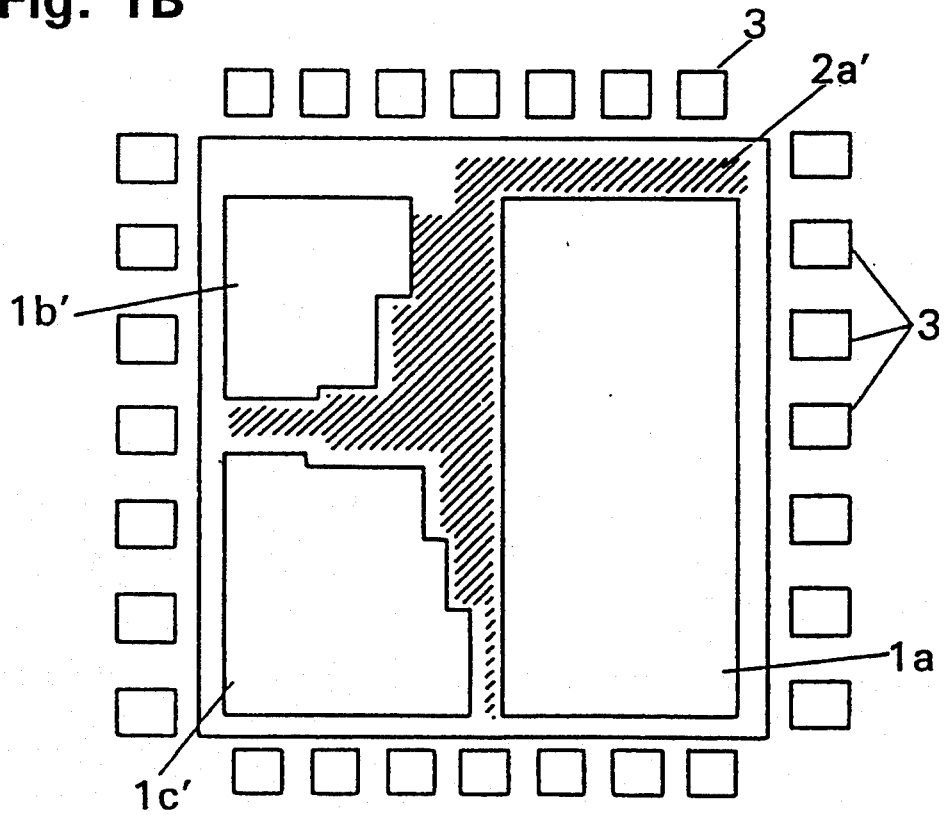
FIG. 1B illustrates the layout of the chip after the block shape optimization according to an embodiment of the invention.

A preferred embodiment of the invention will be described with reference to the accompanying drawings. FIG. 1A shows the layout of the entire chip of a VLSI before the block shape optimization, and FIG. 1B illustrates the layout of the same after the block shape optimization according to a preferred embodiment of the invention. In the layout before optimization shown in FIG. 1A, three rectangular blocks 1a–1c are disposed. Hatched portion in FIG. 1A which is designated by 2a indicates the density of wirings formed in channels. The width of the wiring density 2a represents the area necessary for wiring therethrough. The numeral 3 designates I/O cells.

According to the embodiment, blocks are classified into two categories, variable-shape blocks and fixed-shape blocks. In a variable-shape block, its shape can be varied (i.e., when the block is assumed rectangular, its four sides can be made irregular) by varying the arrangement of circuit elements contained within the block. The shape of a fixed-shape block is not variable. In this embodiment the blocks 1b and 1c are variable-shape blocks, an the block 1a is a fixed-shape block. When the block shape is changed, the positions of the pins (terminals for wiring connection) of each variable-shape block change in such a way as to follow the change of the block shape. When each variable shape block B can take the shape (x1, y1), (x2, y2), ..., (xn, yn) (wherein (xi,yi) is a vertex of the shape, respectively), a list F(B) of the candidate shapes of the block B is expressed by the following expression (1).

$$F(B) = ((x1, y1)(x2, y2) \ldots (xn, yn)) \qquad (1)$$

FIG. 1A shows a result of the optimization conducted in accordance with the above-mentioned first method in which the optimum rectangular shape for each of the variable-shape blocks 1b and 1c is selected from among the rectangular shapes which the variable-shape blocks can take, so that the chip size can be reduced as much as possible. According to the embodiment, the thus obtained result (FIG. 1A) is further processed, and the irregularity of the block shape is varied in such a way as to compensate for the wiring density distribution between the blocks, thereby obtaining the layout of FIG. 1B and achieving a further reduction of the chip area. In FIG. 1B. the numerals 1b' and 1c' respectively designate the block shapes obtained by optimizing the shapes of the variable-shape blocks 1b and 1c. and 2a' indicates the wiring density obtained after the block shape optimization.

The operation of this embodiment will be described in more detail. As shown in FIG. 2. the embodiment comprises: block rectangular shape and arrangement optimization means 21; inter-block wiring means 22; block shape restriction means 23; rectangular block approximation means 24; block shape optimization means 25; and inner-block layout means with block shape restriction 26. These means sequentially perform the layout process. The size of each variable-shape block (in FIG. 1A, the blocks 1b and 1c) and the dimensional displacement thereof when deformed are accurately estimated before starting the layout. In the steps from the block rectangular shape and arrangement optimization means 21 to the block shape optimization means 25, the layout operation within the variable-shape blocks is not done, but restriction against the block size and shape (hereinafter, referred to as "the shape restriction") is used. The block layout tool is requested to establish the variable-shape blocks under the shape restriction. The actual layout within the blocks is done in the step of the inner-block layout performed in each step will be described.

(Block rectangular shape and arrangement optimization means 21 and Inter-block wiring means 22)

The block rectangular shape and arrangement optimization means 21 optimizes the shape and arrangement of the blocks, while assuming that the shape of each of the blocks is rectangular. In the inter-block wiring means 22, the positions of the pins to be provided on the periphery of the variable-shape blocks and the approximate routing of the wiring between the blocks are determined, and based on the result of this determination the wiring density $2a$ between the blocks, i.e., in the channels is obtained. A result of this optimization is shown in FIG. 1A.

(Block shape restriction means 23)

Figure 3A:
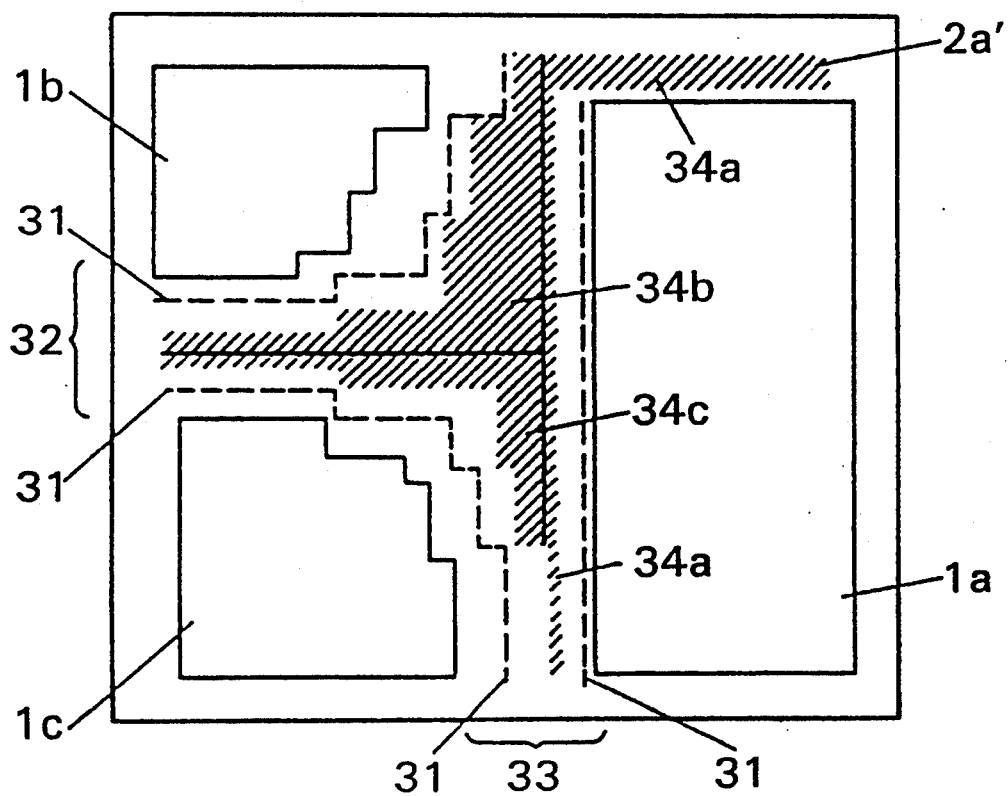
FIGS. 3A, 3B and 3C are diagrams illustrating shape restrictions used in one embodiment.

As shown In FIG. 3A, the block shape restriction means 23 imposes a shape restriction 31 in which irregularities are formed so as to compensate the variation in the wiring density between the blocks. When a wiring channel 32 is to be considered, the shape restriction 31 is imposed on each of the variable-shape blocks $1b$ and $1c$ which are disposed on either side of the wiring channel 32 to oppose each other, so that the shapes of the variable-shape blocks $1b$ and $1c$ are varied in such a manner as to compensate for the variation in the wiring density in the wiring channel 32. On the other hand, when a wiring channel 33 is to be considered, one of the two blocks disposed on either side of the wiring channel 33 is the variable-shape block $1c$, and the other of the two blocks is the fixed-shape block $1a$. In this case, the shape restriction 31 is imposed on the variable-shape block $1c$ in such a manner as to compensate for the variation in the wiring density in the wiring channel 33, and the shape restriction 31 is not imposed on the fixed-shape block $1a$. That is, one of the linear sides of the fixedshape block $1a$ which is rectangular is used as the shape restriction 31.

(Rectangular block approximation means 24)

Figure 3B:
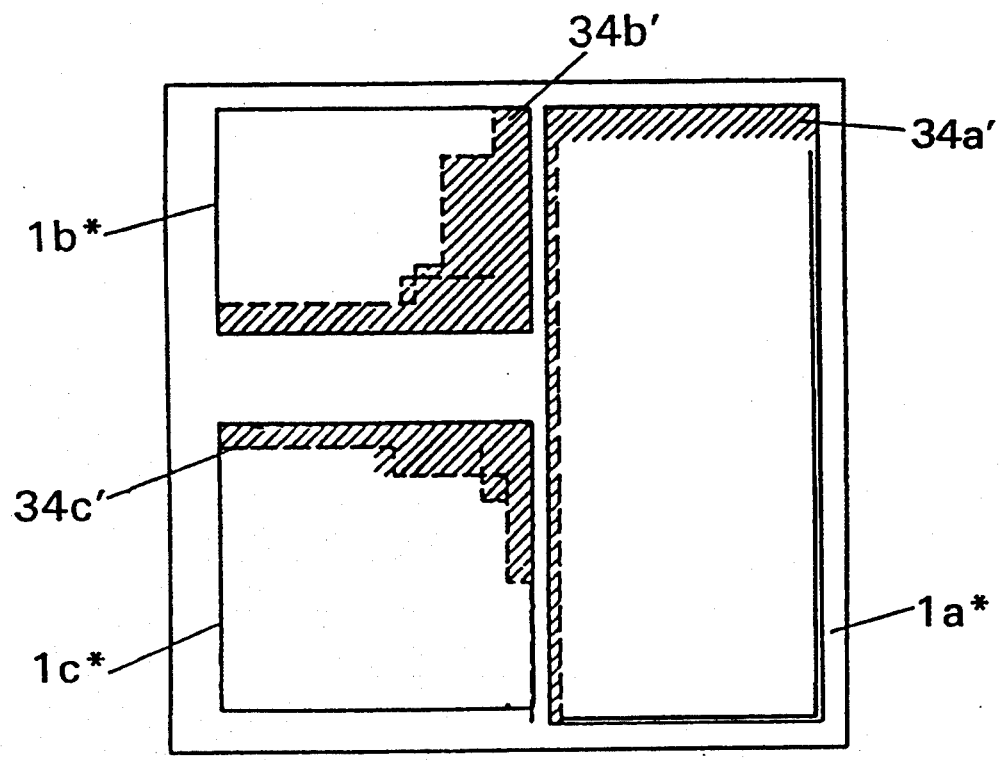

The rectangular block a approximation means 24 makes the wiring fill the concaves caused by the irregularities which have been formed on the sides of each block by the block shape restriction means 23, and forms a combination of each block and wiring into a rectangular shape. More specifically, as shown in FIG. 3A, the inter-block wiring density $2a'$ is divided into three sections $34a$, $34b$ and $34c$, and then the combinations of the block $1a$ and the wiring density section $34a$, the block $1b$ and the wiring density section $34b$, and the block $1c$ and the wiring density section $34c$ are each formed into a rectangular shape. The thus formed blocks $1a*$, $1b*$ and $1c*$ (FIG. 3B) including the wiring sections incorporated therein are transformed in shape while maintainting the rectangular shape. This processing serves as s preparation for the next step in which the above-mentioned first method is applied for the optimization of the rectangular shape, using the block shape optimization means 25.

Figure 4A:
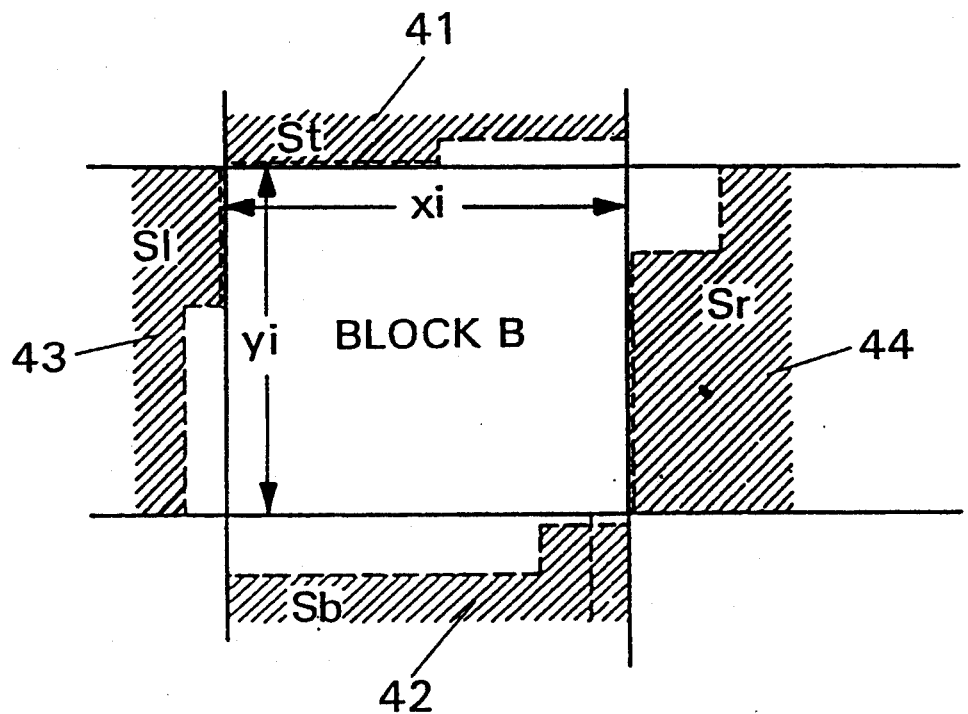
FIGS. 4A and 4B are diagrams illustrating the way of obtaining candidates f a block shape with wiring sections incorporated therein.
Figure 4B:
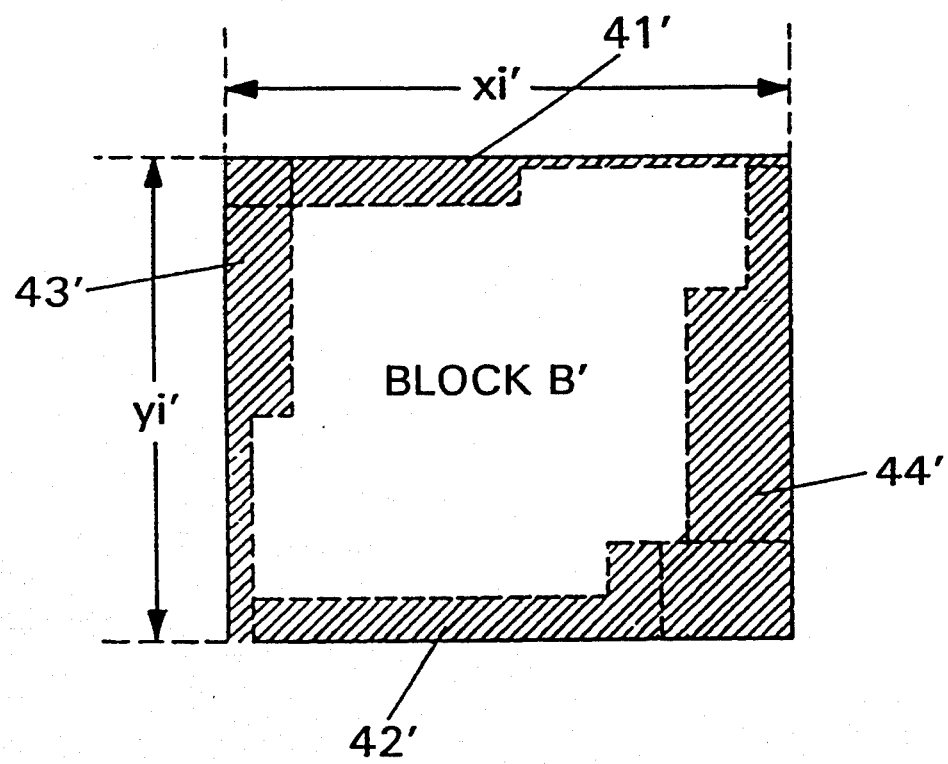

Referring to FIGS. 4A and 4B, the manner of obtaining a list $F(B')$ of candidate shapes which each rectangular block $B'$ with the wiring deposited thereto can take will be described. As described above, the shape which the block B (wherein no wiring section is included) can take is expressed as $F(B) = (xi, yi)$ (where $i = 1, 2, \ldots, n$). The areas of wiring densities 41, 42, 43 and 44 which are to be deposited along the four sides (i.e. the top, bottom, left and right sides) of the block B are denoted as St, Sb, Sl and Sr, respectively. The candidate shapes which the rectangular block $B'$ with the wiring sections deposited thereto can take (i e, $F(B') = (xi', yi')$ $(i = 1, 2, \ldots, n)$) is obtained by the following calculation.

$$F(B') = ((xi', yi')(x2', y2') \ldots (xn', Yn'))  \quad (2)$$

$$xi' = xi + (Sl + Sr)/yi \quad (3)$$

$$yi' = yi + (St + Sb)/xi \quad (4)$$

In FIG. 4B, $41'$–$44'$ indicate the deposited areas of wiring densities 41–44, respectively. The deposited areas $41'$–$44'$ are obtained as follows: First, the heights of the areas Sl and Sr are multiplied by $yi'/yi$, and the heights c the areas St and Sb are multiplied by $xi'/xi$. Then, the resulting rectangles are deposited on the sides of the block $B'$, respectively.

(Block shape optimization means 25)

Figure 3C:
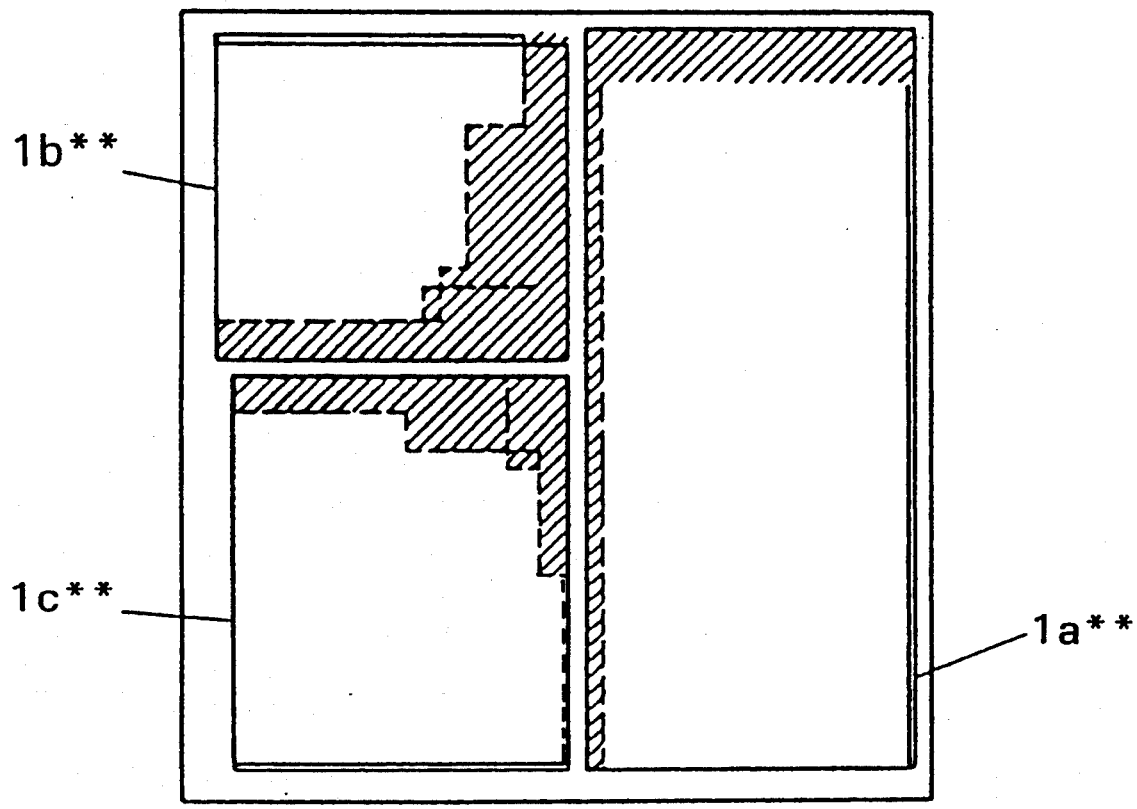

On the basis of the data obtained by the rectangular block approximation means 24 concerning the candidate shapes which each rectangular block $B'$ with the wiring sections deposited thereto can take, the first method is applied for the optimization of the block shape, thereby obtaining blocks $1a$, $1b$ and $1c**$ as shown in FIG. 3C.

(Inner-block layout means with block shape restriction 26)

Figure 5:
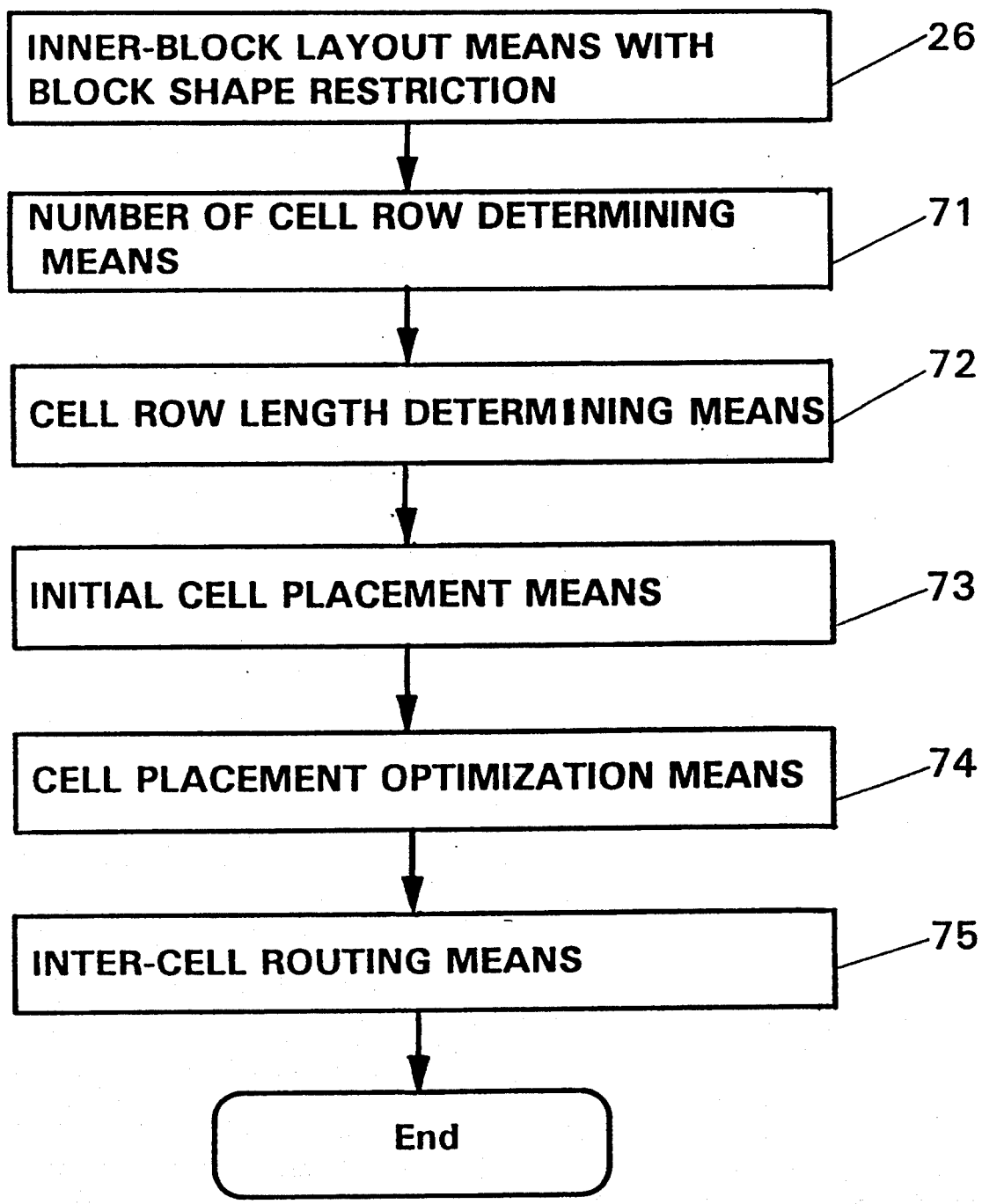
FIG. 5 is a flow chart of the process of inner-block layout means with block shape restriction.
Figure 6:
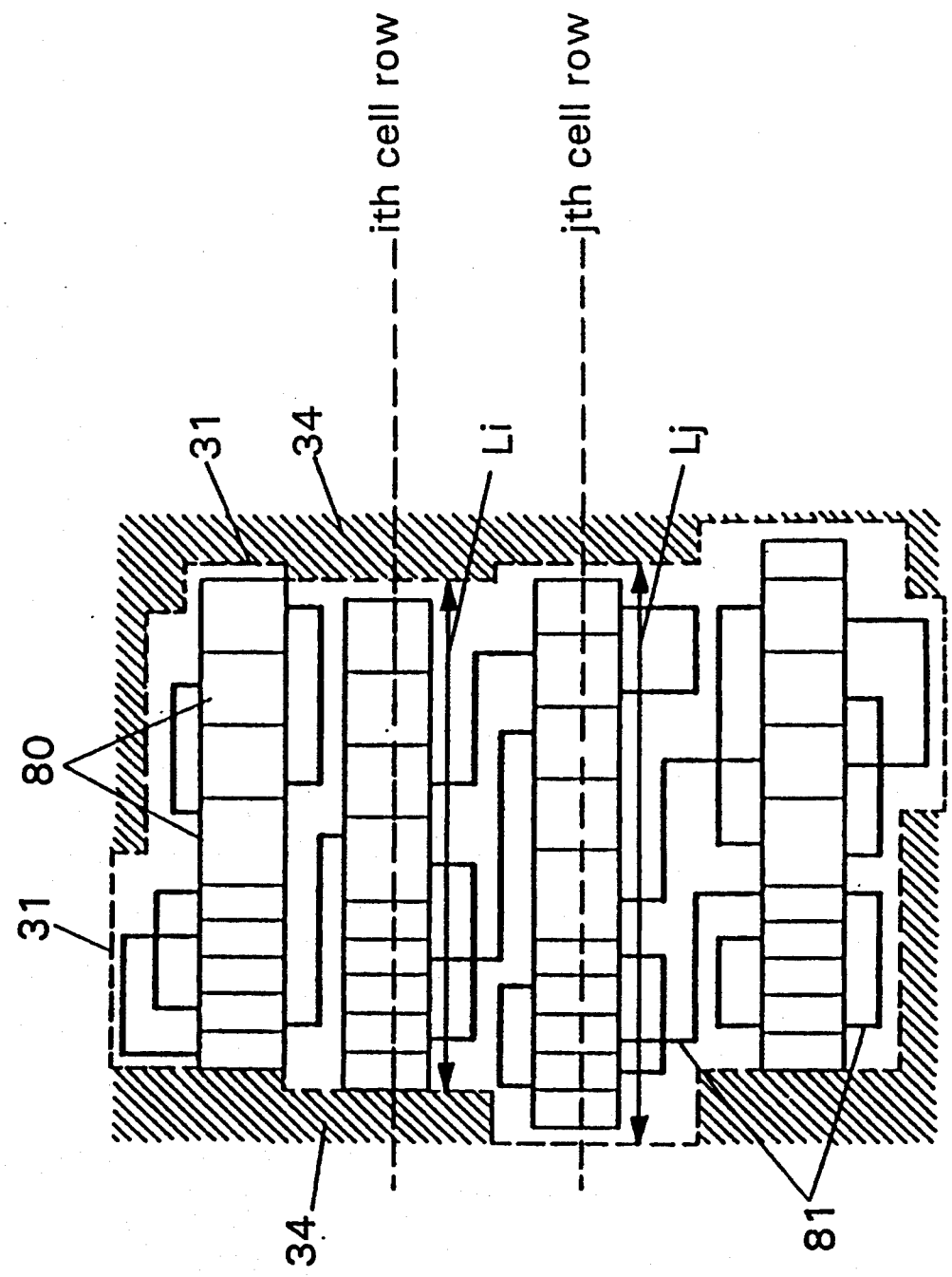
FIG. 6 is a diagram illustrating the inner-block layout means with block shape restriction.

The inner-block layout means with block shape restriction 26 performs the optimization of the internal layout of a block in accordance with the block shape restriction 31. When the block to be processed is a block constructed by the standard cell method, the optimization of the internal layout is accomplished by using the process flow shown in FIG. 5. Namely, the inner-block layout means 26 comprises: number of cell row determining means 71; cell row length determining means 72; initial cell placement means 73; cell placement optimization means 74; and inter-cell routing means 75. FIG. 6 shows an example of an inner-block layout achieved by the inner-block layout means with block shape restriction 26. In FIG. 6, the reference numeral 80 indicates standard cells arranged in rows, and 81 wirings between the cells.

In the number of cell row determining means 71, the channel width necessary for the channel wiring is estimated, and the optimal number of cell rows is obtained on the basis of the result of this estimation. Next, the cell row length determining means 72 obtains the position of each cell row n the basis of the channel wiring width estimated by the number of cell row determining means 71, and the restricted length of a cell row determined by the lateral shape restriction is obtained for the position at which the cell row is to be arranged. The constrained Lengths Li and Lj for the ith and jth cell rows are shown in FIG. 6. The cells are temporarily arranged by the initial cell placement means 73.

In the cell placement optimization means 74, the cell placement is optimized. In this optimization, the cells are moved and exchanged in a repeated manner, under the restrictions that the length of a cell row k must not exceed $A \cdot Lk$ (where Lk is the restricted length of the cell row k, and A is variable having an initial value greater than one and monotonically decreasing with the progress of optimization process), and that the block height should be minimized.

Figure 7:
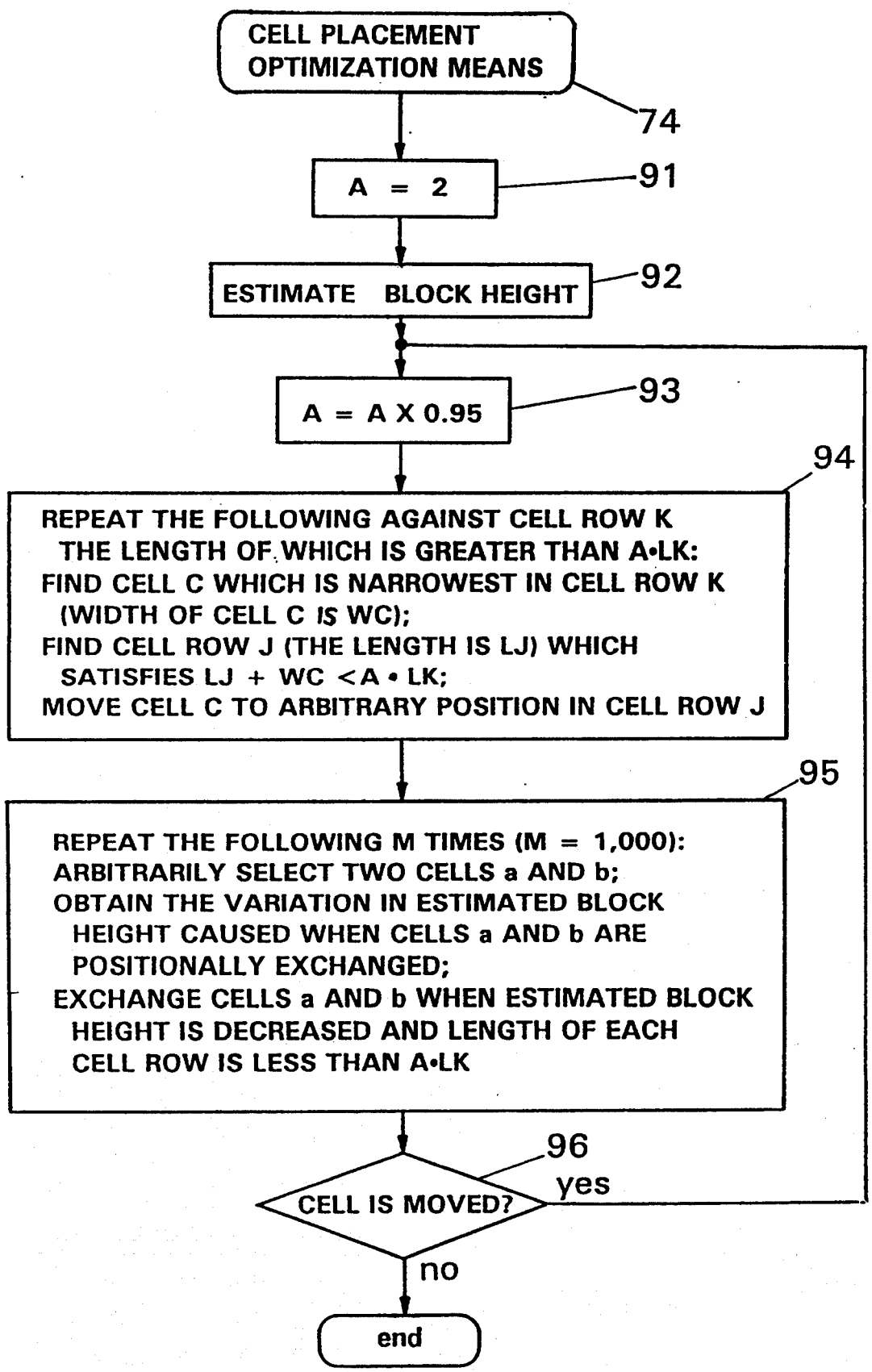
FIG. 7 is a flow chart illustrating cell placement optimization means.

The cell placement optimization means 74 can be realized by the algorithm shown in FIG. 7. An initial value of the variable A is set in step 91. The initial value of the variable A is set greater than one, but, in view of the optimization of the result and the shortened period of time for calculation, it is meaningless to set the initial value to a large number (in this embodiment, the initial value is two). In step 92, suitable initial placement is given to each cell, and the block height with such cell placement is estimated. Steps 93-96 constitute a processing loop for optimizing the cell placement while controlling the cell length constraint. Each time the process passes through step 93, the value of the variable A is gradually decreased. In step 94, when a cell row k fails to satisfy the restriction that the length of a cell row must not exceed A·Lk, cells are moved in such a way as to satisfy this restriction. In step 95, cells in cell rows in which the cell row length restriction is satisfied are moved so that the block height (the length of the block which is perpendicular to the direction along which the cell rows elongate) is minimized. Then, it is judged in step 96 whether or not the condition to terminate the cell moving operation has been satisfied. More specifically, in step 96, when the restriction by the value A is tightened up to the point where no more cell movement takes place, the process exits from the loop from step 93 to step 96.

In inter-cell routing means 75, a channel wiring technique commonly used in the art is conducted. For the uppermost and lowermost cell rows, however, the wiring route is determined so that the wiring density distribution follows the shape restriction.

In the invention, the manner of cell placement in a block is not restricted to the above, and can be arbitrarily selected. In a semiconductor integrated device having blocks other than those formed from standard cells (e.g., blocks formed from cells arranged in a lattice array with wiring provided for interconnection of the cells), the block layout which satisfies the shape restriction can be achieved by previously providing a lattice map for arranging cells in accordance with the shape restriction 31, and by arranging the cells and wiring the cells on the lattice. In the chip layout containing the thus constructed blocks, it is also possible to minimize the chip area by effectively controlling the shape irregularity of the blocks. Examples of such a semiconductor integrated device are so-called gate array devices, and sea-of-gate devices.

As described above, the present invention achieves a further reduction in the chip size of VLSI circuits, and the effect achieved is remarkable.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method for providing an internal layout of a variable-shape block in a semiconductor integrated circuit device wherein a shape of said variable-shape block can be changed into an irregular shape and said variable-shape block has a plurality of cells, and for optimizing the internal layout of said variable-shape block while satisfying a restriction against the shape of said variable-shape block, said method comprising the steps of:
   obtaining the number of cell rows by which the height of said variable-shape block satisfies said restriction;
   obtaining the position and length of each of said cell rows in said variable-shape block which satisfies said restriction;
   arranging the cells in an optimum cell placement by which each of said number of cell rows can be formed in said length; and
   determining paths for wirings between cells.

2. An apparatus for the layout of a semiconductor integrated circuit device wherein one or more blocks are arranged on a chip and wirings for electrical connections are formed in areas in the vicinity of said one or more blocks, said one or more blocks being classified into variable-shape blocks in which a shape thereof can be changed into an irregular shape and fixed-shape blocks in which a shape thereof is fixed,
   said apparatus comprising:
   means for supposing that each of said one or more blocks has a tentative rectangular shape, and for temporarily optimizing the shape and position of each of said one or more blocks;
   means for obtaining temporary paths for said electrical connections;
   means for placing restrictions on the shape of each of said variable-shape blocks so as to compensate for the variation in the density of said temporary paths;
   means for optimizing the shape of each of said variable-shape blocks by changing said tentative rectangular shape thereof into an irregular shape so as to satisfy said restrictions; and
   means for optimizing the internal layout of each of said variable-shape blocks in accordance with said restrictions, thereby minimizing the size of said chips.

3. The apparatus of claim 2 wherein said variable-shape blocks comprise standard cells arranged in a plurality of rows and electrical connections between said one or more blocks are formed in areas in the vicinity of said variable-shape blocks,
   said apparatus further comprising means for optimizing the length of each of said rows so as to optimize the shape of each of said variable-shape blocks, thereby minimizing the size of said chip.

4. An apparatus for providing an internal layout of a variable-shape block in a semiconductor integrated circuit device wherein a shape of said variable-shape block can be changed into an irregular shape and said variable-shape block has a plurality of cells, and for optimizing the internal layout of said variable-shape block while satisfying a restriction against the shape of said variable-shape block, said apparatus comprising:
   a first means for obtaining the number of cell rows by which the height of said variable-shape block satisfies said restriction;
   a second means for obtaining the position and length of each of said cell rows in said variable-shape block which satisfies said restriction;
   a third means for arranging the cells in an optimum cell placement by which each of said number of cell rows can be formed in said length obtained by the second means; and a fourth means for determining paths for wirings between the cells in the optimum cell placement arranged by the third means.

5. A method for optimizing the layout of a semiconductor integrated circuit device wherein one or more blocks are arranged on a chip with wirings for electrical connections formed in areas in the vicinity of said one or more blocks, said one or more blocks being classified into variable-shape blocks in which a shape thereof can be changed into an irregular shape and fixed-shape blocks in which a shape thereof is fixed, whereby the shape of each of said variable-shape blocks is optimized so as to minimize the size of the chip, the method comprising the steps of:

supposing that each of said one or more blocks has a tentative rectangular shape, and temporarily optimizing the shape and position of each of said one or more blocks;

obtaining temporary paths for said electrical connections;

placing restrictions on the shape of each of said variable-shape blocks so as to compensate for the variation in the density of said temporary paths;

optimizing the shape of each of said variable-shape blocks by changing said tentative rectangular shape thereof into an irregular shape so as to satisfy said restrictions; and optimizing the internal layout of each of said variable-shape blocks in accordance with said restrictions.

6. The method of claim 5 wherein said variable-shape blocks comprise standard cells arranged in a plurality of rows and electrical connections between said one or more blocks are formed in areas in the vicinity of said variable-shape blocks, said method further comprising the step of optimizing the length of each of said rows so as to optimize the shape of each of said variable-shape blocks.

7. A method for designing a semiconductor integrated circuit device having one or more rectangular blocks arranged on a chip and wirings for electrical connections formed in areas around said one or more blocks, said one or more blocks being classified into variable-shape blocks in which a shape thereof can be changed into an irregular shape and fixed-shape blocks in which a shape thereof is fixed, said method comprising the steps of:

estimating an initial optimum shape and position for each of said one or more blocks;

determining temporary paths for said electrical connections in areas around said one or more blocks;

placing restrictions on the shape of each of said variable-shape blocks according to a wiring density of said temporary paths;

determining an optimum shape for each of said variable-shape blocks by changing said rectangular shape thereof into an irregular shape in accordance with said restrictions, the step of determining the optimum shape further including the steps of dividing the wiring density between adjacent sides of said variable-shape blocks and forming the divided portions of the wiring density with the respective adjacent variable-shape blocks to form a rectangular block shape; and determining an optimum internal layout for each of said variable-shape blocks in accordance with said restrictions, the step of determining an optimum internal layout being performed by calculating the area of the wiring densities combined within the respective rectangular block shape.

8. The method of claim 7 wherein the step of determining temporary paths for said electrical connections is based upon routing of wiring between said one or more blocks and positions of wiring connection pins on the periphery of said one or more blocks to determine wiring density between said one or more blocks.

9. The method of claim 7 wherein the step of placing restrictions on the shape for each of said variable-shape blocks includes the use of at least one side of one of said fixed-shape blocks as a shape restriction.

10. The method of claim 7 wherein said variable-shape blocks include standard cells arranged in a plurality of rows on a chip and said electrical connections between said one or more blocks are formed around said variable-shape blocks, further comprising the step of determining an optimum length for each of said rows so as to optimize the shape of each of said variable-shape blocks to minimize the overall size of said chip.

11. A method for designing an internal layout of a variable-shape block in a semiconductor integrated circuit device wherein a shape of said variable-shape block can be changed into an irregular shape and said variable-shape block has a plurality of cells arranged in rows, and for optimizing the shape of said variable-shape block while satisfying a restriction against the shape of said variable-shape block, the method comprising the steps of:

(a) determining the number of cell rows which satisfies a restriction on the height of said variable-shape block;

(b) determining the position and length of each of said cell rows in said variable-shape block which satisfies said restriction;

(c) ascertaining an optimum placement of each cell within said length of each cell row determined in step (b) and arranging the respective cells in the optimum placement; and (d) ascertaining paths for wirings between the cells in the optimum placement arranged in step (c).

* * * * *

UNITED STATES PATENT AND TRADEMARK OFFICE
CERTIFICATE OF CORRECTION

PATENT NO. : 5,420,800
DATED : May 30, 1995
INVENTOR(S) : Masahiro Fukui

It is certified that error appears in the above-indentified patent and that said Letters Patent is hereby corrected as shown below:

```
   Column 1, line 40, "method hereinafter" should be --method
(hereinafter--; line 59, "this is invention" should be --this
invention--; line 66, "o f" should be --of--.
   Column 2, line 18, "t he" should be --the--; line 63,
"E aid" should be --said--; line 66, "aspect the" should be
--aspect of the--.
   Column 3, line 7, "aid" should be --said-; lines 8-9,
"wirings be between" should be --wirings between--; line 32,
"An" should be --in--; line 61, "candidates f a" should be
-- candidates of a--.
   Column 4, line 25, "an" should be --and--; line 52, "1c."
should be --1c,--.
   Column 5, lines 6-7, "layout performed" should be --layout
means with block shape restriction 26.  The processing
performed--; line 42, "fixedshape" should be --fixed-shape--;
line 45, "block a approximation" should be --block
approximation--.
   Column 6, line 5, "S1" should be --Sl--; line 7, "i e ,"
should be --i.e.,--; line 20, "S1" should be --Sl--; line 21,
"heights c the" should be --heights of the--; line 55, "row n
the" should be --row on the--;
```

UNITED STATES PATENT AND TRADEMARK OFFICE
CERTIFICATE OF CORRECTION

PATENT NO. : 5,420,800
DATED : May 30, 1995
INVENTOR(S) : Masahiro Fukui

It is certified that error appears in the above-indentified patent and that said Letters Patent is hereby corrected as shown below:

Column 6, line 60, "Lengths" should be --lengths--.

Signed and Sealed this

Second Day of January, 1996

Attest:

BRUCE LEHMAN

*Attesting Officer*    *Commissioner of Patents and Trademarks*